(12) United States Patent
Yamada

(10) Patent No.: US 7,442,956 B2
(45) Date of Patent: Oct. 28, 2008

(54) ORGANIC EL DEVICE AND ELECTRONIC APPARATUS

(75) Inventor: Tadashi Yamada, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/092,844

(22) Filed: Mar. 30, 2005

(65) Prior Publication Data
US 2005/0236620 A1    Oct. 27, 2005

(30) Foreign Application Priority Data
Apr. 26, 2004   (JP) ............................. 2004-129651

(51) Int. Cl.
H01L 29/04 (2006.01)
(52) U.S. Cl. .................. 257/59; 257/72; 257/E21.413; 257/E29.278; 438/69; 438/103
(58) Field of Classification Search ................ 257/59, 257/72, 79, 88; 438/69, 103
See application file for complete search history.

(56) References Cited

U.S. PATENT DOCUMENTS

| | | | |
|---|---|---|---|
| 5,777,392 | A | 7/1998 | Fujii |
| 6,518,962 | B2 | 2/2003 | Kimura et al. |
| 6,788,003 | B2 | 9/2004 | Inukai et al. |
| 6,946,802 | B2 | 9/2005 | Hayashi |
| 6,949,883 | B2 | 9/2005 | Matsueda |
| 7,081,704 | B2 | 7/2006 | Yamazaki et al. |
| 7,218,297 | B2 | 5/2007 | Inukai et al. |
| 7,327,090 | B2 | 2/2008 | Hayashi |
| 2002/0064966 | A1 * | 5/2002 | Seki et al. ................... 438/780 |
| 2003/0063081 | A1 | 4/2003 | Kimura et al. |
| 2003/0142043 | A1 * | 7/2003 | Matsueda ..................... 345/30 |
| 2004/0201048 | A1 | 10/2004 | Seki et al. |
| 2005/0168138 | A1 * | 8/2005 | Okunaka et al. ............ 313/504 |
| 2005/0184654 | A1 * | 8/2005 | Kobayashi ................... 313/504 |
| 2005/0275771 | A1 | 12/2005 | Matsueda |
| 2006/0250073 | A1 | 11/2006 | Yamazaki et al. |
| 2007/0132793 | A1 * | 6/2007 | Miyagawa et al. .......... 345/690 |
| 2008/0106209 | A1 | 5/2008 | Hayashi |

FOREIGN PATENT DOCUMENTS

| | | |
|---|---|---|
| JP | A-7-311315 | 11/1995 |
| JP | A-8-264423 | 10/1996 |
| JP | B2 3328297 | 7/2002 |
| JP | A-2002-304155 | 10/2002 |
| JP | A-2003-233330 | 8/2003 |

(Continued)

*Primary Examiner*—Ahmed Sefer
(74) *Attorney, Agent, or Firm*—Oliff & Berridge, PLC

(57) ABSTRACT

To provide an organic EL device capable of making uniform a dry speed of a liquid material coated in a display area. There is provided an organic EL device in which a plurality of pixels $X_R$, $X_G$, $X_B$ is arranged in an effective display area of a substrate and each of the pixels $X_R$, $X_G$, $X_B$ is provided with a first organic EL element having a functional film formed by a liquid phase method, wherein a dummy area D having a plurality of dummy pixels $D1_R$, $D1_G$, $D1_B$, $D2_R$, $D2_G$, $D2_B$ for inspection of characteristics is provided around the effective display area and each dummy pixel is provided with a second organic EL element having a functional film formed using the same process as the functional film of the first organic EL element.

7 Claims, 6 Drawing Sheets

| | FOREIGN PATENT DOCUMENTS | | |
|---|---|---|---|
| JP | A-2004-94236 | 3/2004 | |
| JP | A-2004-127924 | 4/2004 | |
| JP | 2004-200158 | * | 7/2004 |
| KR | 2003-47774 | 6/2003 | |
| WO | WO98/40871 | 9/1998 | |

* cited by examiner

ORGANIC EL DEVICE AND ELECTRONIC APPARATUS

BACKGROUND

The present invention relates to an organic EL device and an electronic apparatus.

In recent years, development of organic electroluminescence elements (hereinafter, referred to as organic EL element) as a self luminescent display element has been advanced. As such an organic EL element, there has been known an organic EL element obtained by forming a high-polymer organic luminescent material using an inkjet method (see Patent Document 1).

[Patent Document 1] Japanese Patent No. 3328297

Since liquid droplets having a diameter of µm order can be ejected and coated with a high resolution by using the inkjet method, the organic luminescent material can be patterned with high accuracy. However, in such a method, the dry condition can vary at the step of drying the liquid droplets, thereby causing a non-uniform thickness distribution in the display area. That is, since the outer circumferential portion of the display area has a vapor pressure of a solvent lower than that of the central portion of the display area, the thickness of the outer circumferential portion tends to be smaller than that of the central portion of the display area. Such a non-uniform distribution of the thickness causes non-uniform brightness or non-uniform color.

The present invention is contrived to solve the above-mentioned problems. An object of the present invention is to provide an organic EL device capable of preventing deterioration in display quality arising from non-uniform dry.

SUMMARY

In order to accomplish the above-mentioned object, according to an aspect of the present invention, there is provided an organic EL device in which a plurality of pixels is arranged within an effective display area of a substrate and each pixel is provided with a first organic EL element having a functional film formed by a liquid phase method, wherein a dummy area having a plurality of dummy pixels for inspection of characteristics is provided around the effective display area and each dummy pixel is provided with a second organic EL element having a functional film formed using the same process as the functional film of the first organic EL element.

As described above, when the functional film is formed using the liquid phase process, the outer circumferential portion of the area coated with the liquid material is rapidly dried and the central portion thereof is dried in a stable state. The present invention stabilizes the dry condition of the effective display area, by expanding the area coated with the liquid material to the outside of the effective display area and allowing the non-uniform dry to occur in the expanded portion. That is, in the present invention, when the functional film is formed in the effective display area, the same functional film is formed in the dummy area outside the effective display area, so that the vapor pressure of a solvent in the outer circumferential portion of the effective display area is approximately equal to that in the central portion thereof at the time of drying the functional film. As a result, since the thickness of the functional film in the whole effective display area can be made to be uniform, it is possible to perform high-quality display without non-uniform brightness or non-uniform color. In the above-mentioned structure, since the second organic EL elements having a luminescent structure are provided in the dummy area and the second organic EL elements are used as inspecting elements for inspection of characteristics, it is not necessary to provide a particular inspection structure in the substrate, thereby realizing a compact construction.

In the organic EL device according to the present invention, signals supplied to the pixels of the effective display area may be corrected on the basis of the inspection result of the dummy pixels. Specifically, the dummy area may have a plurality of dummy pixels arranged along the outer circumference of the effective display area and the signals supplied to the pixels may be corrected on the basis of the inspection result of the first dummy pixels. As a result, it is possible to perform more uniform display.

In this case, the plurality of first dummy pixels in the dummy area may emit different colors and the first dummy pixels emitting the same color may be connected in series to each other. Since the dummy pixels are not involved in displaying, the dummy pixels do not need to be individually driven like the pixels in the effective display area. Therefore, as in the construction described above, the plurality of first dummy pixels can be connected in series and the first dummy pixels connected in series can be driven at a time (that is, can be inspected at a time). As a result, it is possible to simplify the circuit structure.

In the organic EL device according to the present invention, the dummy area may have a plurality of second dummy pixels arranged perpendicularly to the outer circumference of the effective display area and variation in thickness of the functional film at the outer circumferential portion of the effective display area may be detected on the basis of continuous variation in luminescent characteristic of the second dummy pixels arranged toward the effective display area from the outer circumference of the dummy area. As described above, the present invention stabilizes the dry condition in the effective display area by allowing the dummy area to absorb the difference in dry speed. However, the difference may not be sufficiently absorbed depending upon the dry condition, and thus the non-uniformity in thickness of the functional film may occur at the outer circumferential portion of the effective display area as well as the dummy area. In the construction described above, by detecting the thickness distribution of the functional film in accordance with the variation in luminescent characteristic, it is possible to simply check whether the non-uniformity in thickness occurs in the effective display area. For example, when the luminescent brightness is saturated (becomes constant) before reaching the effective display area, it can be concluded that the variation in thickness of the functional film occurs only at the outer circumferential side of the dummy area. On the other hand, when the luminescent brightness is not stable even in the vicinity of the effective display area, it can be concluded that the variation in thickness of the functional film occurs in the effective display area.

In this case, the plurality of second dummy pixels may be connected in series to each other and the second dummy pixels connected in series may be driven at a time (that is, can be inspected at a time). As a result, it is possible to simplify the circuit structure.

According to another aspect of the present invention, there is provided an organic EL device in which a plurality of pixels is arranged in an effective display area of a substrate, each pixel is provided with a first organic EL element having a functional film formed by a liquid phase method, and a functional film is bonded to the surface of the substrate, wherein a dummy area having a plurality of dummy pixels serving as alignment marks in bonding the functional film is provided around the effective display area and each dummy pixel is provided with a second organic EL element having a functional film formed by using the same process as the functional film of the first organic EL element.

In the construction described above, since the thickness of the functional film in the whole effective display area can be made to be uniform, it is possible to perform high-quality display without non-uniform brightness or non-uniform color. In the above-mentioned construction, since the second organic EL elements having a luminescent structure are provided in the dummy pixels and the second organic EL elements are used as alignment marks for bonding a film, it is not necessary to provide particular alignment marks in the substrate, thereby realizing a compact construction.

In the organic EL device according to the present invention, the plurality of dummy pixels may be connected in series to each other and the dummy pixels connected in series may be driven at a time (that is, a shape of the alignment marks can be exhibited by allowing the dummy pixels to emit light at a time). As a result, it is possible to simplify the circuit structure.

According to another aspect of the present invention, there is provided an electronic apparatus comprising the above-mentioned organic EL device. As a result, it is possible to provide an electronic apparatus having a small size and high display quality.

DETAILED DESCRIPTION OF EMBODIMENTS

Figure 1:
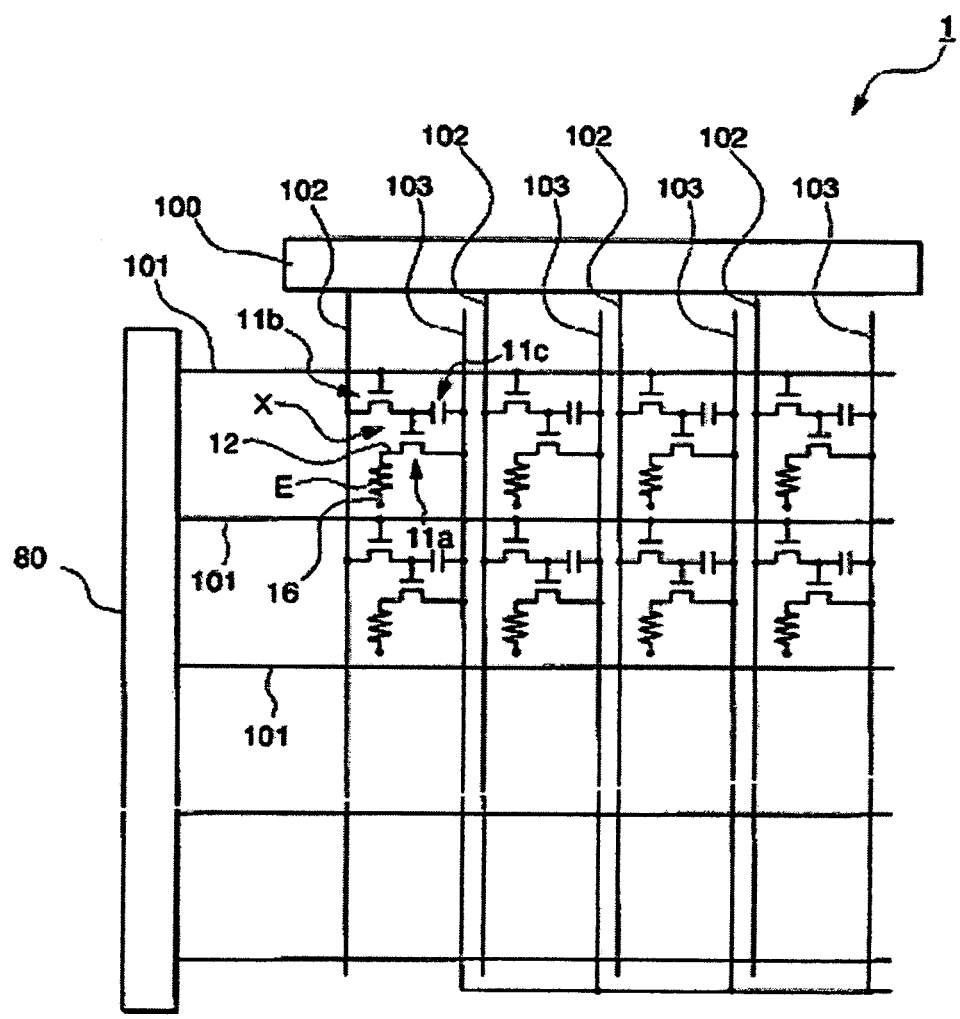
FIG. 1 is a diagram illustrating an equivalent circuit of an organic EL device according to a first embodiment.

Hereinafter, preferred embodiments of the present invention will be described with reference to the drawings. In the drawings, in order to allow respective layers or members to be recognized in the drawings, the respective layers or members are expressed in different scales.

First Embodiment (Organic EL Device)

First, a first embodiment of the present invention will be described with reference to FIGS. 1 to 5.

The organic EL device according to the present embodiment explained in the following description is an active matrix organic EL display device using thin film transistors (hereinafter, referred to as TFT) as switching elements, and is a color organic EL display device having three kinds of high-polymer organic light-emitting layers of R (red), G (green), and B (blue).

FIG. 1 is a schematic diagram illustrating an equivalent circuit of the organic EL device according to the present embodiment.

The organic EL display device 1 has a wiring structure including a plurality of scanning lines 101, a plurality of signal lines 102 extending in a direction perpendicular to the scanning lines 101, and a plurality of power lines (power source lines) 103 extending in parallel to the signal lines 102, and pixels X are formed at the respective intersections between the scanning lines 101 and the signal lines 102.

A data-line driving circuit 100 including a shift register, a level shifter, video lines, and analog switches is connected to the signal lines 102. A scanning-line driving circuit 80 including a shift register and a level shifter is connected to the scanning lines 101. Each pixel X is provided with a switching TFT 11b of which the gate electrode is supplied with a scan signal through the corresponding scanning line 101, a holding capacitor 11c holding a pixel signal supplied from the corresponding signal line 102 through the switching TFT 11b, a driving TFT 11a (driving electronic element) of which the gate electrode is supplied with the pixel signal held by the holding capacitor 11c, a positive electrode (pixel electrode) 12 into which driving current flows through the corresponding power source line 103 when electrically connected to the power source line 103 via the driving TFT 11a, and an electro-optical layer E disposed between the positive electrode 12 and a negative electrode (common electrode) 16. The positive electrode 12, the negative electrode 16, and the electro-optical layer E constitute a light-emitting element, that is, an organic EL element. The electro-optical layer E according to the present embodiment includes a plurality of functional films such as an organic light-emitting layer, a hole injecting layer, etc.

According to the organic EL display device 1, when the scanning line 101 is driven and the switching TFT 11b is turned on, the potential of the signal line 102 at that time is held by the holding capacitor 11c and the on-off state of the driving TFT 11a is determined in accordance with the state of the holding capacitor 11c. Current flows in the positive electrode 12 from the power source line 103 via the channel of the driving TFT 11a and the current flows in the negative electrode 16 via the electro-optical layer E. The electro-optical layer E emits light in accordance with the quantity of current flowing therethrough.

Next, a two-dimensional structure of the organic EL display device 1 according to the present embodiment will be described with reference to FIG. 2.

Figure 2:
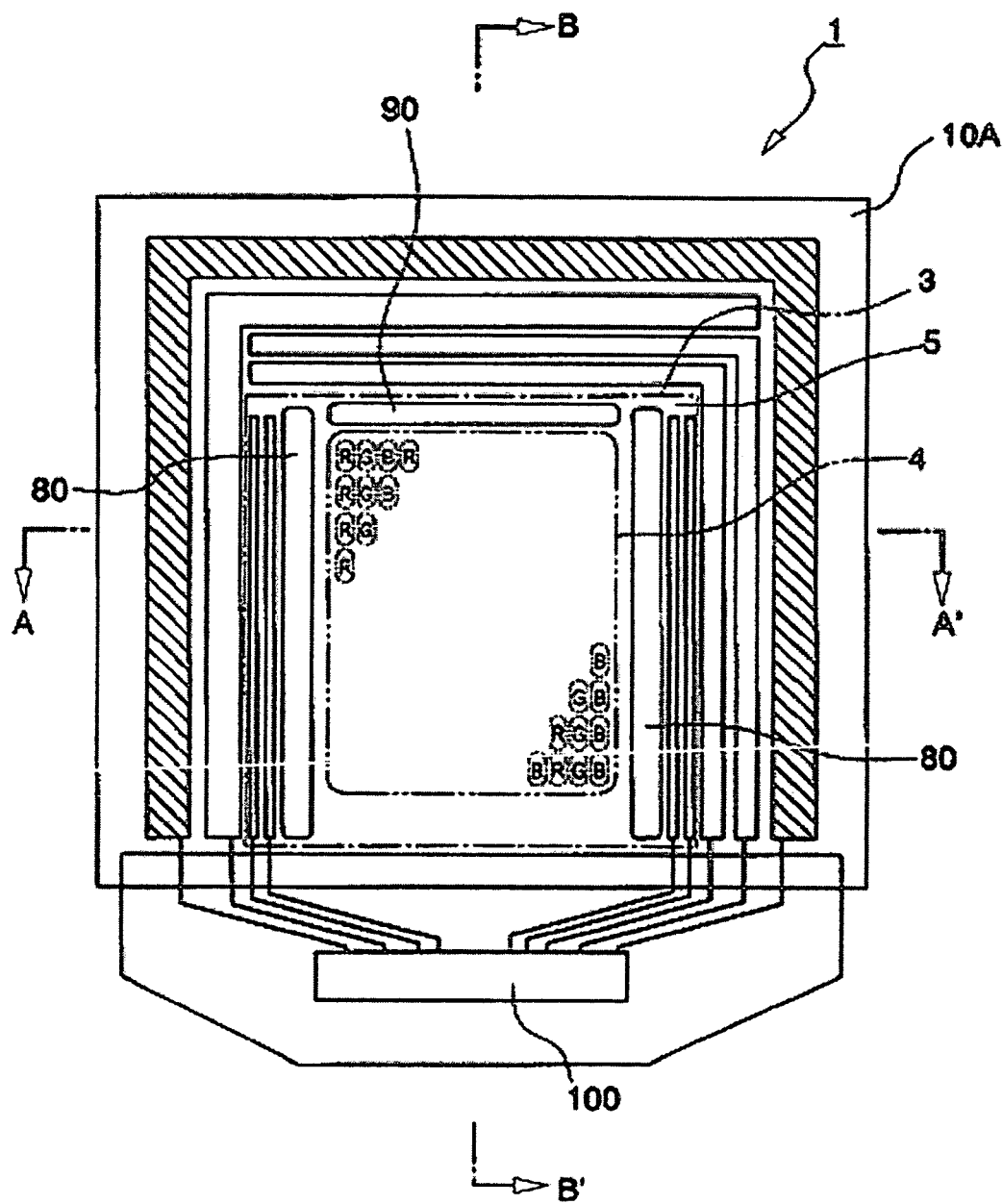
FIG. 2 is a schematic diagram illustrating a two-dimensional structure of the organic EL device according to the first embodiment.

As shown in FIG. 2, the organic EL display device 1 according to the present embodiment includes a substrate 10A having an insulating ability, an pixel electrode area (not shown) in which pixel electrodes connected to the switching TFT not shown are arranged in a matrix shape on the substrate 10A, power source lines 103 (see FIG. 1) which are disposed around the pixel electrode area and connected to the respective pixel electrodes, and a pixel section 3 (the inside of a one-dot-chained line in the figure) which has an approximately rectangular shape as seen two-dimensionally and positioned at least on the pixel electrode area. The pixel section 3 is divided into an effective display area 4 (the inside of a two-dot-chained line in the figure) at the center thereof and a dummy area 5 (an area between the one-dot chained line and the two-dot chained line) disposed around the effective display area 4.

In the effective display area 4, display areas R, G, and B having the pixel electrodes, respectively, are disposed apart in the A-A' direction and in the B-B' direction. At both sides of the effective display area 4 in the figure, the scanning-line driving circuit 80 is disposed. The scanning-line driving circuit 80 is positioned at the bottom side of the dummy area 5. An inspection circuit 90 is disposed at the upper side of the effective display area 4 in the figure. The inspection circuit 90 is positioned at the bottom side of the dummy area 5. The inspection circuit 90 is a circuit for inspecting operation status of the organic EL display device 1. The inspection circuit comprises, for example, an inspection-information output means not shown for outputting the inspection result to the outside, and performs inspection of quality and defects of the display device in the course of manufacturing or at the time of loading.

The driving voltages of the scanning-line driving circuits 80 and the inspection circuit 90 are applied through a driving-voltage supply section from a predetermined power source. A driving control signal and the driving voltage to the scanning-line driving circuit 80 and the inspection circuit 90 are transmitted or applied through a driving-control signal supply section, etc. from a predetermined main driver, etc. taking charge of the operation control of the organic EL display device 1. In this case, the driving control signal is an instruction signal from the main driver, etc. taking charge of the control when the scanning-line driving circuit 80 and the inspection circuit 90 output the signals.

The dummy area 5 is a non-display area not involved in displaying. In the present embodiment, the dummy area 5 is used as a waste area of a liquid material when forming the functional film in the effective display area 4 using a liquid phase method. That is, when a functional film is formed by coating and drying a liquid material, the arrangement of the liquid material only in the effective display area 4 causes different dry conditions in the central portion and the circumferential portion of the effective display area 4 as described above, thereby causing non-uniformity in thickness of the functional film. On the contrary, when such a dummy area 5 is provided around the effective display area 4, vapor of a solvent vaporized from the dummy area 5 makes the same dry condition in the inside and the outside of the effective display area 4, so that the functional film is formed uniform in the whole effective display area 4.

In the present embodiment, the dummy area 5 is used for another practical use, for example, as an inspection area for inspecting characteristics of the organic EL elements, as well as for use of preventing non-uniform dry in the effective display area 4.

Figure 3:
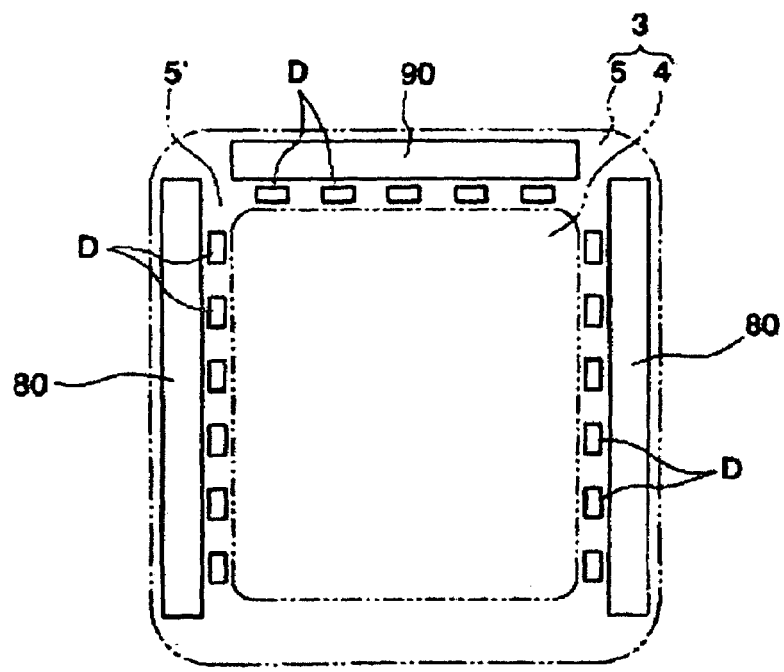
FIG. 3 is a schematic diagram illustrating a structure of a dummy area of the organic EL device according to the first embodiment.
Figure 4:
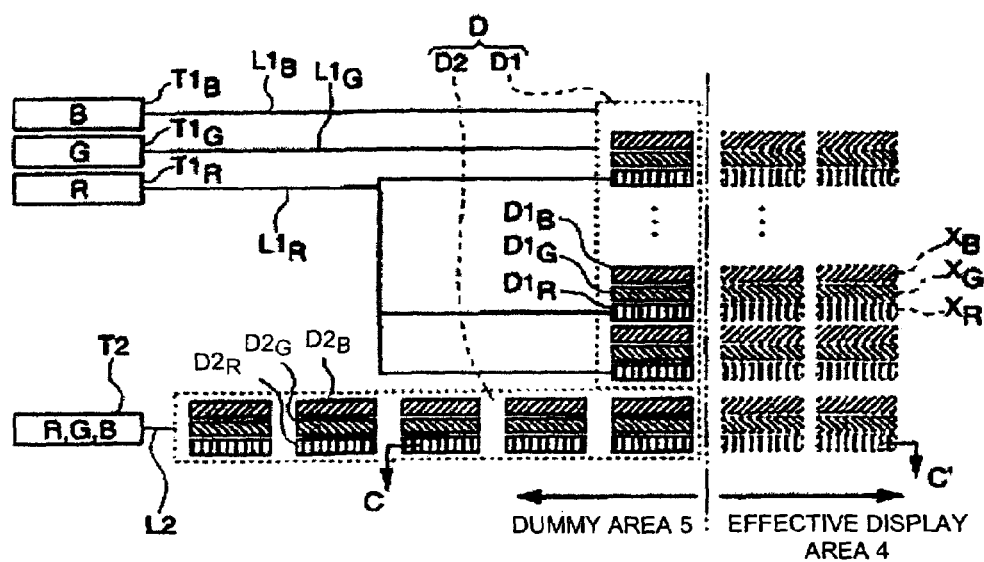
FIG. 4 is an enlarged schematic diagram illustrating an important part of the dummy area of the organic EL device according to the first embodiment.

FIGS. 3 and 4 are schematic diagrams illustrating a concrete structure of the dummy area 5. As shown in FIG. 3, in addition to the waste area 5' of the liquid material, a plurality of inspection areas D are provided around the effective display area 4. The respective inspection areas D are provided with a plurality of dummy pixels for inspection of characteristics of the organic EL elements. The dummy pixels have the same pixel structure as that of the pixels X of the effective display area 4, except that switching structures such as TFT or holding capacitors are not provided therein. That is, each dummy pixel is provided with a dummy organic EL element (second organic EL element) having the same structure as that of the organic EL element (first organic EL element) provided in the effective display area 4, and each dummy organic EL element can emit light by current supplied from the respective power source lines (not shown).

As shown in FIG. 4, the inspection area D includes a first area D1 for inspecting deviation in characteristic of the organic EL elements and a second area D2 for inspecting the thickness distribution of the functional films.

The first area D1 includes a plurality of first dummy pixels $D1_R$, $D1_G$, and $D1_B$ arranged along the outer circumference of the effective display area 4. The first dummy pixels include several kinds of dummy pixels emitting different colors (first dummy pixels $D1_R$ emitting red, first dummy pixels $D1_G$ emitting green, and first dummy pixels $D1_B$ emitting blue in the present embodiment), similarly to the pixels $X_R$, $X_G$, and $X_B$ of the effective display area 4. The first dummy pixels are used to inspect a current-brightness characteristic (I-L characteristic), etc. of the organic EL elements. In the present embodiment, the deviation in a luminescent characteristic is inspected using the first dummy pixels $D1_R$, $D1_G$, and $D1_B$, and the signals to be applied to the respective pixels $X_R$, $X_G$, and $X_B$ of the effective display area 4 are corrected in a unit of lines in accordance with the deviation. The above-mentioned pixel signals are signals corrected based on the inspection result of the first dummy pixels, and a uniform luminescent characteristic in the effective display area can be obtained by such correction.

Since the first dummy pixels are not involved in displaying, it is not necessary to individually drive the first dummy pixels like the pixels in the effective display area. Therefore, in the present embodiment, the dummy pixels emitting the same color are connected in series to each other and the dummy pixels connected in series are driven at a time (are inspected at a time). As a result, it is possible to simplify the circuit structure. In FIG. 4, reference numerals $L1_R$, $L1_G$, and $L1_B$ denote wires for taking out the inspection signals, and reference numerals $T1_R$, $T1_G$, and $T1_B$ denote external terminals. The wires $L1_R$, $L1_G$, and $L1_B$ are provided as common wires for the first dummy pixels $D1_R$ emitting red, the first dummy pixels $D1_G$ emitting green, and the first dummy pixels $D1_B$ emitting blue, respectively.

The second area D2 is provided with a plurality of second dummy pixels $D2_R$, $D2_G$, and $D2_B$ arranged perpendicularly to the outer circumference of the effective display area 4. The first dummy pixels include several kinds of dummy pixels emitting different colors (second dummy pixels $D2_R$ emitting red, second dummy pixels $D2_G$ emitting green, and second dummy pixels $D2_B$ emitting blue in the present embodiment), similarly to the pixels $X_R$, $X_G$, and $X_B$ in the effective display area 4. The second dummy pixels are used to inspect the thickness distribution of the functional film of the organic EL elements. In the present embodiment, by inspecting variation in a luminescent characteristic of the second dummy pixels, the variation in thickness of the functional film extending from the outer circumference of the dummy area to the effective display area is detected. As described above, the present embodiment stabilizes the dry condition in the effective display area by allowing the dummy area to absorb the difference in dry speed. However, the difference may not be sufficiently absorbed depending upon the dry condition, and thus the non-uniformity in thickness of the functional film may occur at the outer circumferential portion of the effective display area as well as the dummy area. In the present construction, by detecting the thickness distribution of the functional film on the basis of the variation in luminescent characteristic, it is possible to simply check whether the non-uniformity in thickness occurs in the effective display area. For example, when the luminescent brightness is saturated (becomes constant) before reaching the effective display area, it can be concluded that the variation in thickness of the functional film occurs only at the outer circumference side of the dummy area. On the other hand, when the luminescent brightness is not stable even in the vicinity of the effective display area, it can be concluded that the variation in thickness of the functional film occurs in the effective display area.

The second dummy pixels $D2_R$, $D2_G$, and $D2_B$ are connected in series to each other. When the luminescent characteristic is inspected, the luminescent characteristic of the respective second dummy pixels is individually inspected with CCD, etc., by driving the second dummy pixels at a time. In FIG. 4, reference numeral L2 denotes a wire for taking out an inspection signal and reference numeral T2 denotes an external terminal. The wire L2 is provided as a common wire for the second dummy pixels $D2_R$ emitting red, the second dummy pixels $D2_G$ emitting green, and the second dummy pixels $D2_B$ emitting blue.

Next, the cross-sectional view of the organic EL display device 1 will be described with reference to FIG. 5(d).

The organic EL display device 1 sequentially comprises positive electrodes 12, an electro-optical layer E, and a negative electrode 16 on an element substrate 10. In the element substrate 10, a circuit section 11 is formed on a substrate body 10A made of glass or resin. On the circuit section 11, the positive electrodes 12 having an approximately rectangular shape as seen two-dimensionally are arranged in a matrix shape correspondingly to the pixels of the effective display area 4 and the dummy pixels of the dummy area 5. In the circuit section 11, various wires such as the scanning lines 101, the signal lines 102, etc. or an electronic circuit including holding capacitors 11c and TFTs 11a and 11b are formed in the effective display area 4. On the other hand, in the dummy area 5, only the wires for driving the dummy pixels are formed, but switching structures such as TFTs, etc. for individually driving the dummy pixels are not formed. Bank layers 13 having openings at respective pixel positions (which include the pixels in the effective display area 4 and the dummy pixels in the dummy area 5) are formed on the element substrate 10 on which the positive electrodes 12 are formed. The bank layers 13 serves as partition walls dividing the respective pixels, and the electro-optical layers E including the organic light-emitting layer 15 are formed in the areas (that is, in the openings H of the bank layers 13) divided by the bank layers 13.

The bank layers 13 have a two-layer structure of an inorganic bank layer 13a made of an inorganic insulating material such as silicon oxide, titanium oxide, etc. and an organic bank layer 13b made of an organic insulating material such as acryl resin, polyimide resin, etc. The bank layers 13a and 13b are provided with openings H1 and H2 (hereinafter, generically referred to as an opening H) communicating with each other on the flat portions of the positive electrodes 12. The openings H1 of the inorganic bank layers 13a are provided in the flat portions of the positive electrodes 12 and the circumferential portions thereof extend over the circumferential portions of the positive electrodes 12. The organic bank layers 13b are provided in the flat portions of the inorganic bank layers 13a, and the width thereof is smaller than that of the inorganic bank layers 13a.

The above-mentioned electro-optical layers E are formed in the openings H communicating with each other in the bank layers 13, and a negative electrode 16 is provided to cover the bank layers 13 and the electro-optical layers E.

The positive electrodes 12 and the negative electrode 16 are made of a conductive material other than ITO. For example, in the bottom emission structure in which light emitted from the electro-optical layers E is taken out from the positive electrode side, the positive electrodes 12 are made of a light-transmitting conductive material such as ITO. In this case, in order to take out the light, which is emitted toward the negative electrode, from the positive electrode side, the negative electrode 16 can be made of a high-reflectance metal material such as Al or Ag, or can employ a stacked structure of a light-transmitting material and a high-reflectance metal material such as Al/ITO. On the contrary, in the top emission structure in which the emitted light is taken out from the negative electrode side, the negative electrode 16 is made of a light-transmitting conductive material and the positive electrodes 12 are made of a high-reflectance conductive material. In this case, the negative electrode 16 suitably employs a structure in which ITO for giving conductivity is stacked, for example, on a co-deposited film of bathocuproine (BCP) and cesium (Cs) is used as the negative electrode 16. The negative electrode 16 is disposed to cover the exposed surfaces of the bank layers 13 and the electro-optical layers E, and serves as a common electrode common to the pixels.

The electro-optical layers E have a structure in which a hole injecting layer 14 and an organic light-emitting layer 15 are sequentially stacked from the bottom.

As a material for forming the hole injecting layer 15 (a hole injecting material), for example, polythiophene derivatives, polypyrrole derivatives, etc., or doped substances in which the above-mentioned materials are doped with acidic material such as polystyrene sulfonic acid (PSS) can be used. For example, PEDOT:PSS in which PEDOT is doped with PSS can be employed in the polythiophene derivatives.

The organic light-emitting layers 15 are made of a well-known luminescent material capable of emitting fluorescence or phosphorescence. Specifically, high-polymer luminescent substances such as (poly) paraphenylenevinylene derivatives, polyphenylene derivatives, polyfluorene derivatives, polyvinylcarbazole, polythiophene derivatives, etc., or low-polymer organic luminescent dyes such as perylene dye, coumarin dye, rhodamine dye, etc. are suitably used. It is more preferably that conjugated polymers which should be a luminescent material include an arylenevinylene or polyfluorene structure. The materials may be doped with materials such as rubrene, perylene, 9,10-diphenylanthracene, tetraphenylbutadiene, Nile red, coumarin 6, quinacridone, etc.

The surface of the element substrate 10 having the above-mentioned structure can be sealed with a sealing can having a desiccant agent or a sealing material (not shown) having gas barrier ability. For example, silicon oxide such as $SiO_2$, or silicon nitride such as SiN, or silicon oxynitride such as $SiO_xN_y$ can be suitably used as the sealing material. A protective film may be interposed between the negative electrode 16 and the sealing material, as needed. When an interlayer insulating layer disposed below the positive electrodes 12 is made of silicon oxide, silicon nitride, or silicon oxynitride, the organic EL elements composed of the positive electrodes 12, the electro-optical layers E, and the negative electrode 16 are surrounded with a gas-barrier film (that is, the interlayer insulating film and the sealing material), so that it is possible to provide an organic EL device having higher reliability.

(Method of Manufacturing Organic EL Device)

Next, a method of manufacturing an organic EL device according to the present invention will be described. FIG. 5 is a cross-sectional view schematically illustrating steps of manufacturing the organic EL display device 1 according to the present embodiment.

The method of manufacturing the organic EL display device 1 according to the present embodiment includes, for example, (1) a bank-layer forming step, (2) a hole-injecting-layer forming step, (3) a light-emitting-layer forming step, (4) a negative-electrode (common-electrode) forming step and a sealing step, and (5) an inspection step. The method of manufacturing the organic EL display device is not limited to the steps, but other steps may be excluded therefrom or added thereto. Hereinafter, the respective steps will be described.

(1) Bank-Layer Forming Step

Figure 5A:
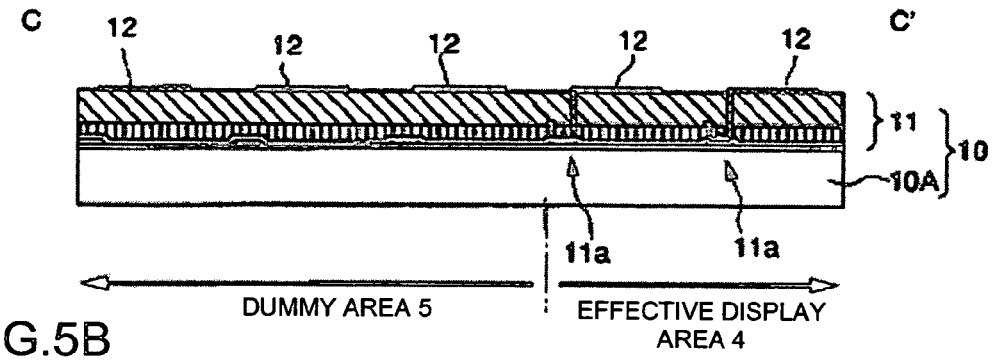
FIGS. 5A-5D are process diagrams illustrating a method of manufacturing the organic EL device according to the first embodiment.

First, the element substrate 10 shown in FIG. 5(a) is prepared. The element substrate 10 comprises the circuit section 11 on the substrate body 10A such as a glass substrate. In the circuit section 11, pixel switching structures such as the scanning lines 101, the signal lines 102, the TFTs 11a, the holding capacitors 11b, etc. are provided in the effective display area 4. Only the wires for driving the dummy pixels are provided in the dummy area, and the switching structures such as TFTs, etc. for individually driving the dummy pixels are not provided therein. On the circuit section 11, the positive electrodes 12 as pixel electrodes are arranged in the pixels in the effective display area 4 and the dummy pixels in the dummy area 5, respectively.

Figure 5B:
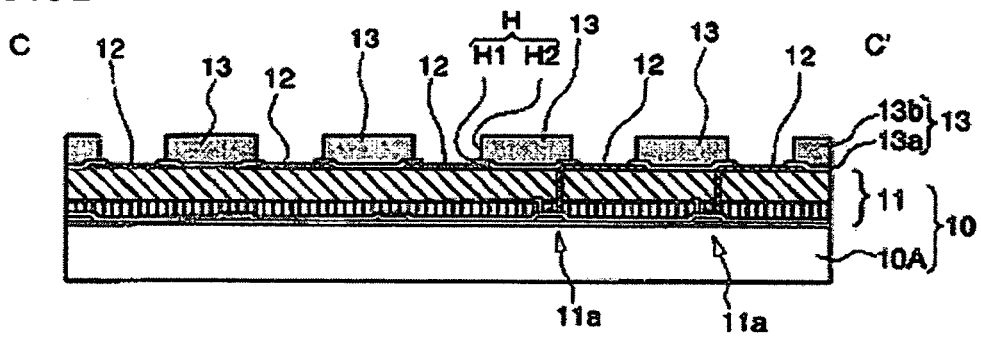

In the process diagram shown in FIG. 5(b), the bank layers 13 (the inorganic bank layers 13a and the organic bank layers 13b) for dividing the pixels and the dummy pixels are formed on the element substrate 10. Here, an inorganic insulating film made of silicon oxide, titanium oxide, etc. is first formed using a deposition method or a sputtering method. A part of the electrode surfaces of the positive electrodes 12 are exposed by forming the openings H1 in the respective pixel areas and the respective dummy pixel areas using a patterning process. At this time, the edges of the openings H1 are positioned at the insides (that is, the central sides of the positive electrodes 12) of the outer circumferential portions of the positive electrodes 12. It is preferable that the thickness of the inorganic insulating film ranges 50 nm to 200 nm. In this way, the inorganic bank layers 13a are formed.

Next, an organic insulating film made of acryl resin, polyimide resin, etc. is formed using a spin coating method to cover the surfaces of the inorganic bank layers 13a and the positive electrodes 12, and then the openings H2 communicating with the openings H1 are formed by the patterning process. At this time, the edges of the openings H2 are positioned at the outsides (that is, the outer circumference sides of the positive electrodes 12) of the edges of the openings H1. The thickness of the organic insulating film ranges preferably 0.1 μm to 3.5 μm, and the thickness is more preferably about 2 μm. In this way, the organic bank layers 13b are formed.

(2) Hole-Injecting-layer Forming Step

Figure 5C:
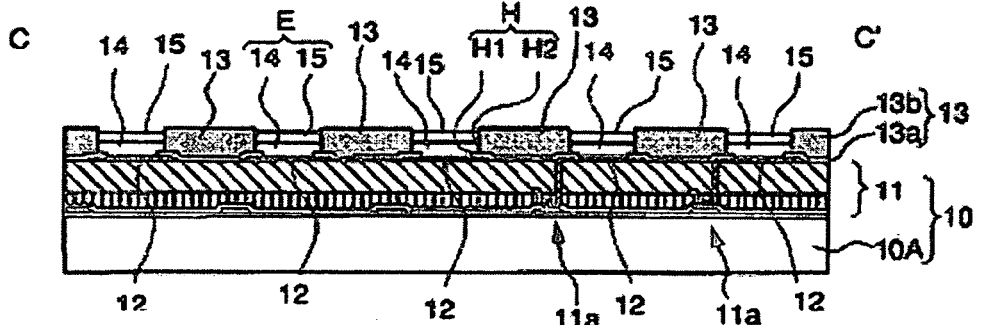

Next, as shown in FIG. 5(c), the hole injecting layers 14 are formed in the openings H of the bank layers 13 using a liquid droplet ejecting method. In this step, first, an ejecting head of an inkjet apparatus is filled with a liquid material containing a hole injecting material, and then the liquid material is ejected into the openings H of the bank layers 13 from ejecting nozzles while the ejecting head and the substrate 10 are relatively moved (liquid-droplet ejecting step). Then, by removing the solvent of the liquid material through a dry process, the hole injecting material contained in the liquid material is made into a film (dry step). As a result, the hole injecting layers 14 are formed on the exposed surfaces of the positive electrodes 12.

In this step, since the liquid material is arranged in the periphery (the dummy area 5) of the effective display area 4 as well as in the effective display area 4, a problem that the outer circumferential portion of the effective display area 4 is much more rapidly dried than the central portion thereof does not occur in the dry step.

A solution in which the hole injecting material is dissolved in a polar solvent can be used as the liquid material. Examples of the polar solvent can include glycols such as isopropyl alcohol (IPA), n-butyl alcohol, (-butyrolactone, N-methylpyrrolidone (NMP), 1,3-dimethyl-2-imidazolidinone (DMI) and derivatives thereof, carbitol acetate, butyl carbitol acetate, etc. The materials are mixed with a composition suitable for the inkjet process.

The subsequent steps including the hole-injecting-layer forming step are performed preferably in an atmosphere not containing water and oxygen and more preferably in an inert gas atmosphere such as a nitrogen atmosphere, an argon atmosphere, etc.

(Light-Emitting-Layer Forming Step)

Next, an organic light-emitting layer 15 is formed on the hole injecting layer 14 using the liquid droplet ejecting method. In this step, first, an ejecting head of an inkjet apparatus is filled with a liquid material containing a luminescent material having a predetermined color, for example, a blue luminescent material, and the liquid material is ejected into the openings H of the bank layers 13 corresponding to the blue pixels from ejecting nozzles while the ejecting head and the substrate 10 are relatively moved (liquid-droplet ejecting step). Then by removing a solvent of the liquid material using a dry process, the luminescent material contained in the liquid material is made into a film (dry step). As a result, the blue organic light-emitting layers are formed on the exposed surfaces of the hole injecting layers 14. Subsequently, in the same order as formation of the blue organic light-emitting layer, the red (R) organic light-emitting layers and the green (G) organic light-emitting layers are sequentially formed. In FIG. 5(c), the organic light-emitting layers are denoted by reference numeral 15.

In this step, since the liquid material is arranged in the periphery (the dummy area 5) of the effective display area 4 as well as in the effective display area 4, a problem that the outer circumferential portion of the effective display area 4 is much more rapidly dried than the central portion thereof does not occur in the dry step.

A solution in which the luminescent material is dissolved in a non-polar solvent can be used as the liquid material. It is preferable that the non-polar solvent cannot dissolve the hole injecting layers 14. For example, non-polar solvents such as cyclohexylbenzene, dihydrobenzofuran, trimethylbenzene, tetramethylbenzene, etc. can be used. By using such a non-polar solvent as a solvent of the luminescent material, it is possible to coat the liquid material without re-dissolving the hole injecting layer 14.

In this way, the electro-optical layers E are formed on the positive electrodes 12. The order of forming the organic light-emitting layers 15 is not limited to the aforementioned description, but the organic light-emitting layers may be formed in any order.

(4) Negative-electrode (Common-electrode) Forming Step and Sealing Step

Figure 5D:
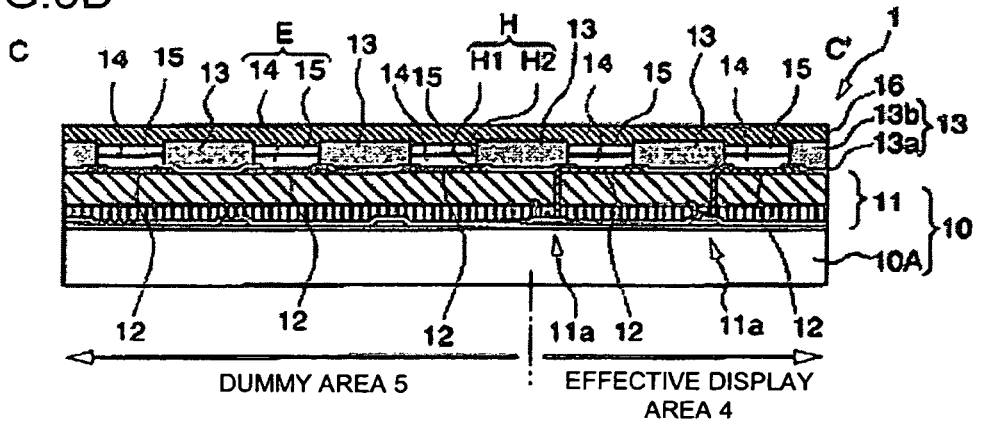

Next, as shown in FIG. 5(d), the negative electrode 16 is formed on the exposed surface of the bank layers 13 and the electro-optical layers E. In the case of the bottom emission structure, it is preferable that the negative electrode 16 is made of a light-reflecting conductive material. For example, a high-reflectance metal film made of Al or Ag can be suitably used. At this time, the negative electrode 16 may be formed as a single-layered film of Al, etc., but may employ a stacked structure of an electron injecting layer and a conductive layer so as to allow light-emitting elements to efficiently emit light. In this case, it is preferable that the electron injecting layer made of a material having a small work function such as Ca, Ba, etc. is formed close to the organic light-emitting layers 15. A thin layer made of LiF may be formed close to the organic light-emitting layer of Ca or Ba, depending upon the luminescent material. The method of forming the electron injecting layer and the conductive layer may be selected from well-known methods such as a resistor-heating deposition method, a sputtering method, etc. The thickness of the negative electrode 16 ranges preferably 100 to 1000 nm, and more preferably 200 to 500 nm.

On the other hand, in the case of the top emission structure, since light emitted from the organic light-emitting layers 15 is taken out from the negative electrode 16 side, the negative electrode 16 must be transparent. Therefore, the negative electrode 16 can be suitably made of ITO. The negative electrode may suitably employ a structure in which a co-deposited film of BCP and Cs is formed on the exposed surfaces of the electro-optical layers E and the bank layers 34 and a light-transmitting conductive material such as ITO for giving conductivity is formed on the whole surface of the substrate using a sputtering method or a CVD method. The negative electrode 16 may employ a stacked structure of an electron injecting layer and a light-transmitting conductive layer such as Ca/ITO.

Thereafter, in order not to deteriorate the negative electrode 16 or the electro-optical layers E due to moisture or oxygen, the surface of the element substrate 10 is sealed with a sealing can or a sealing material having gas barrier ability as needed. It is preferable that the sealing material has gas barrier ability, and for example, silicon oxide such as $SiO_2$, or silicon nitride such as SiN, or silicon oxynitride such as $SiO_xN_y$, can be suitably used as the sealing material. More effectively, a resin layer made of acryl, polyester, epoxy, etc. may be stacked on the inorganic oxide layers.

(5) Inspection Step

Next, characteristics of the organic EL elements are inspected. Here, for example, the following items are inspected.

(a) Inspection of the thickness distribution of the functional films (hole injecting layers 14 or organic light-emitting layers 15) formed by a liquid phase method.

(b) Inspection of deviation in characteristics of the organic EL element.

The inspection of (a) is performed by inspecting continuous variation in a luminescent characteristic toward the effective display area 4 from the outer circumference of the dummy area 5 using the second dummy pixels arranged perpendicularly to the outer circumference of the effective display area 4. Since variation in thickness of the functional film appears as variation in the luminescent characteristic, it can be indirectly checked whether the dry condition is stable at the outer circumferential portion of the effective display area, by inspecting the variation in the luminescent characteristic. For example, when the variation in thickness of the functional film occurs only at the outer circumference side of the dummy area 5, the luminescent brightness is saturated before reaching the effective display area. Accordingly, when the luminescent brightness is constant in the vicinity of the effective display area, it can be determined as a good product. On the other hand, when the luminescent brightness is not stable even in the vicinity of the effective display area, it can be determined as a defective product.

The inspection of (b) is performed by inspecting the luminescent characteristic of the first dummy pixels arranged along the outer circumference of the effective display area 4.

The luminescent characteristic of the organic EL elements may be greatly varied in the same panel in accordance with the I-V characteristic or the I-L characteristic. Such a variation in characteristic causes the non-uniform brightness or the non-uniform color. In the present embodiment, the variation in luminescent characteristic of the organic EL elements is inspected in a unit of lines using the first dummy pixels, and the inspection result is reflected into the pixel signals to be supplied to the pixels in the effective display area 4. Specifically, by preparing a look-up table and reflecting the inspection result in the look-up table, data of the respective pixels are corrected.

In this way, the method of manufacturing the organic EL device 1 according to the present embodiment is completed.

As described above, in the present embodiment, since the same functional film is formed in the dummy area 5 around the effective display area 4 at the same time as forming the functional film in the effective display area 4 using a liquid phase process, the vapor pressure of a solvent in drying the functional film is approximately equal in the central portion of the effective display area and the outer circumferential portion thereof. As a result, the thickness of the functional film can be uniform in the whole effective display area, thereby performing high-quality display without the non-uniform brightness or the non-uniform color. In the present embodiment, since the second organic EL elements having a luminescent structure are provided in the dummy area and the second organic EL elements are used as inspection elements for inspection of characteristics, it is not necessary to provide a particular inspection structure on the substrate, and thus it is possible to realize a compact structure.

Second Embodiment

Next, a second embodiment of the present invention will be described with reference to FIGS. 6 to 8. In the present embodiment, the same members or portions as those of the first embodiment are denoted by the same reference numerals and detailed description thereof will be omitted. The present embodiment is different from the first embodiment, in that a functional film such as a polarizing film is bonded to the substrate 10 on which the organic EL elements are formed and that the organic EL elements provided in the dummy area 5 are used as alignment marks for bonding the functional film.

Figure 6:
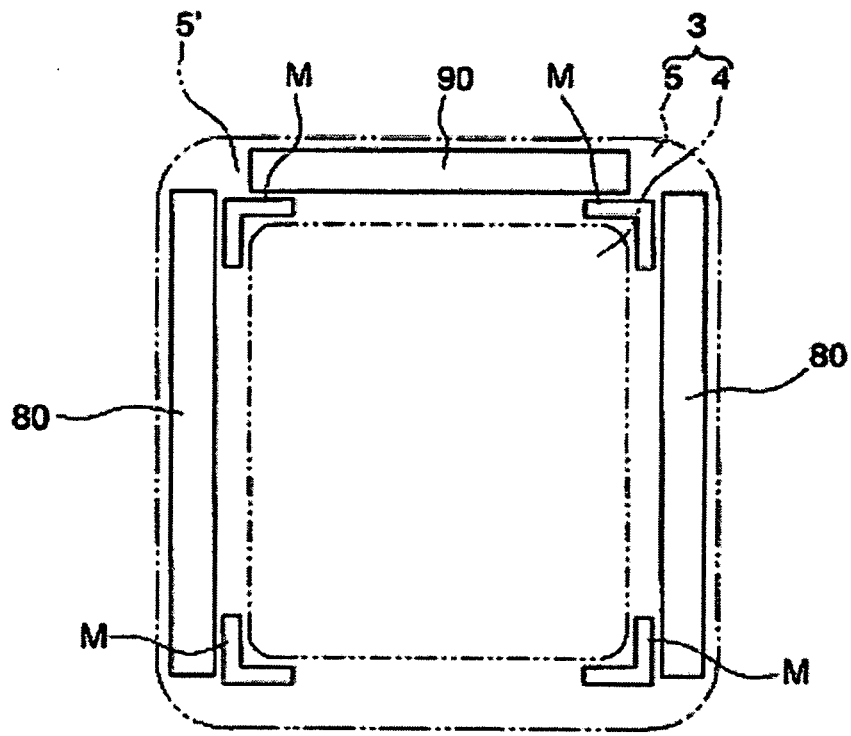
FIG. 6 is a schematic diagram illustrating a structure of a dummy area of an organic EL device according to a second embodiment.
Figure 7:
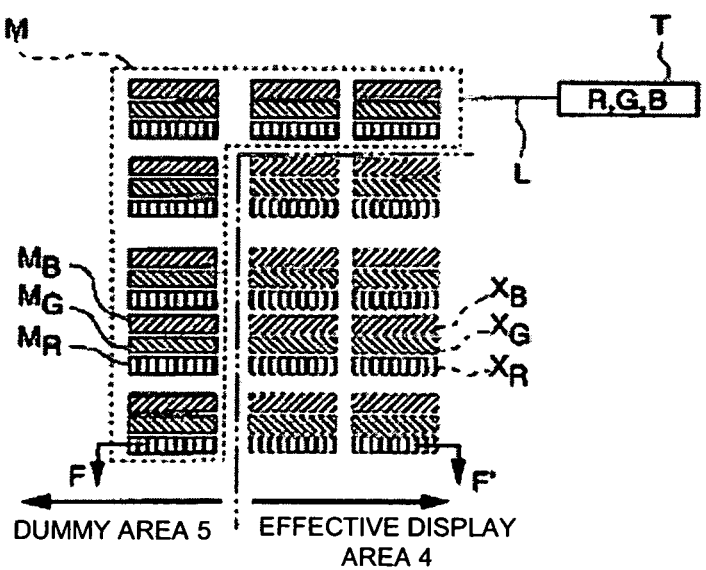
FIG. 7 is an enlarged schematic diagram illustrating an important part of the dummy area of the organic EL device according to the second embodiment.
Figure 8:
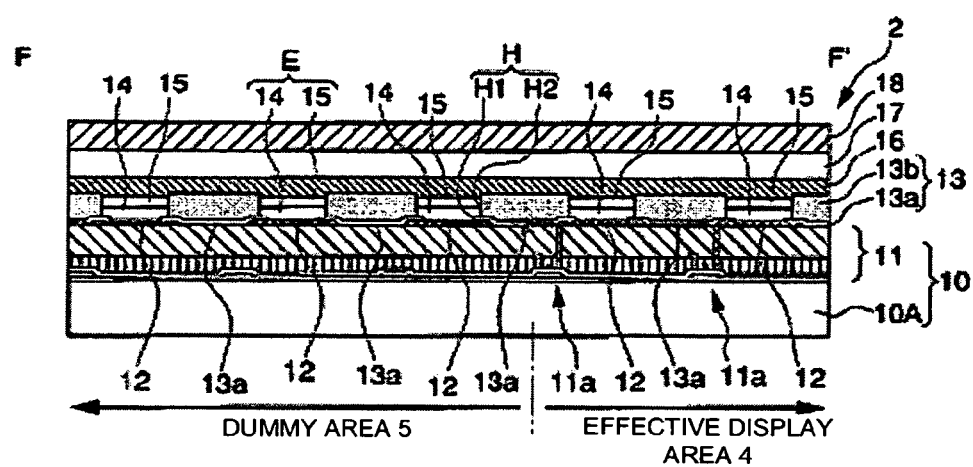
FIG. 8 is a schematic diagram illustrating a cross-sectional structure of the organic EL device according to the second embodiment.

FIGS. 6 and 7 are schematic diagrams illustrating a concrete structure of the dummy area 5. As shown in FIG. 6, a plurality of alignment areas M as well as the area 5' in which a liquid material is wasted is provided around the effective display area 4. The alignment areas M are disposed at four corners of the effective display area 4, and a plurality of dummy pixels for alignment is provided in the respective alignment areas M. The dummy pixels have the same pixel structure as the pixels X in the effective display area 4, except that the switching elements such as TFTs or the holding capacitors are not provided. That is, a dummy organic EL element (second organic EL element) having the same structure of the organic EL element (first organic EL element) provided in the effective display area 4 is provided in each dummy pixel, and each dummy organic EL element can emit light in response to current supplied from the respective power source lines (not shown).

As shown in FIG. 7, a plurality of dummy pixels $M_R$, $M_G$, and $M_B$ arranged along the outer circumference of the effective display area 4 is provided in the alignment areas M. The dummy pixels include several kinds of dummy pixels (dummy pixels $M_R$ emitting red, dummy pixels $M_G$ emitting green, and dummy pixels $M_B$ emitting blue in the present embodiment) emitting different colors, similarly to the pixels $X_R$, $X_G$, $X_B$ in the effective display area 4. Since the dummy pixels are not involved in displaying, it is not necessary to individually drive the dummy pixels like the pixels in the effective display area. Therefore, in the present embodiment, the dummy pixels emitting the same color are connected in series to each other and the dummy pixels connected in series are driven at a time (that is, exhibit a shape of alignment marks by allowing the dummy pixels to emit light at a time). As a result, it is possible to simplify the circuit structure. In FIG. 7, reference numeral L denotes a wire for taking out the signals, and reference numeral T denotes external terminals. The wire L is provided as a common wire for the dummy pixels $M_R$ emitting red, the dummy pixels $M_G$ emitting green, and the dummy pixels $M_B$ emitting blue.

Next, the pixel structure of the organic EL display device 1 will be described with reference to FIG. 8.

The organic EL display device 2 includes the positive electrodes 12, the electro-optical layers E, the negative electrode 16, the protecting layer 17, and the polarizing film 18 on the element substrate 10 in that order. In the element substrate 10, the circuit section 11 is formed on the substrate body 10A made of glass or resin. On the circuit section 11, the positive electrodes 12 having an approximately rectangular shape as seen two-dimensionally are arranged in a matrix shape correspondingly to the respective pixels in the effective display area 4 and the respective dummy pixels in the dummy area 5. In the circuit section 11, electronic circuits including various wires such as scanning lines, signal lines, etc., holding capacitors, and TFTs are formed in the effective display area 4. On the other hand, only the wires for driving the dummy pixels are formed in the dummy area 5, and the switching structures such as TFTs for individually driving the dummy pixels are not formed. On the element substrate 10 on which the positive electrodes 12 are formed, the bank layers 13 having the openings at respective pixel positions (including the pixels in the effective display area 4 and the dummy pixels in the dummy area 5) are formed. The bank layers 13 serve as partition walls for dividing the respective pixels, and the electro-optical layers E including the organic light-emitting layer 15 are formed in the areas divided by the bank layers 13 (that is, in the openings H of the bank layers 13).

Each electro-optical layer E has a structure in which the hole injecting layer 14 and the organic light-emitting layer 15 are stacked from the lower side in that order. The functional films 14 and 15 are formed using a liquid phase method, similarly to the first embodiment. For example, the hole injecting layers 14 are formed by ejecting the liquid material containing the hole injecting material into the openings H of the bank layers 13 using the liquid droplet ejecting method and drying the ejected liquid material. Similarly, the organic light-emitting layers 15 are formed by ejecting the liquid material containing the luminescent material into the openings H of the bank layers 13 using the liquid droplet ejecting method and drying the ejected liquid material. At this time, in the present embodiment, the liquid material is arranged in the periphery (dummy area 5) of the effective display area 4 as well as the effective display area 4. As a result, in the dry step, the problem that the outer circumferential portion of the effective display area 4 is much more rapidly dried than the central portion does not occur.

The surface of the element substrate 10 constructed as described above is sealed with a protective layer 17, and the polarizing film 18 as an antireflective film is bonded to the surface of the protective layer 17. The polarizing film 18 is bonded using the dummy pixels for alignment at the final stage of the method of manufacturing the panel.

As described above, in the present embodiment, since the same functional film is formed in the dummy area 5 around the effective display area 4 at the same time as forming the functional film in the effective display area 4 using a liquid phase process, the thickness of the functional film can be uniform in the whole effective display area, thereby performing high-quality display without the non-uniform brightness or the non-uniform color. In the present embodiment, since the second organic EL elements having a luminescent structure are provided in the dummy area and the second organic EL elements are used as the alignment marks for bonding a film, it is not necessary to provide particular alignment marks on the substrate, and thus it is possible to realize a compact structure.

In the present embodiment, the polarizing film is used as the functional film bonded to the substrate, but the present invention is not limited to it.

(Electronic Apparatus)

Next, an electronic apparatus according to the present invention will be described.

Figure 9:
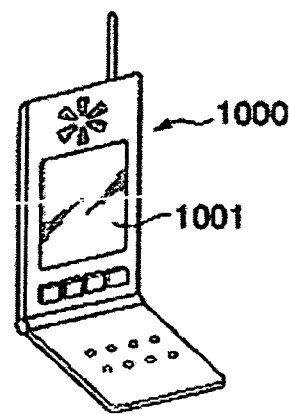
FIG. 9 is a perspective view illustrating an example of an electronic apparatus according to the present invention.

FIG. 9 is a perspective view illustrating an example of an electronic apparatus according to the present invention. A mobile phone 1000 shown in the figure comprises the above-mentioned organic EL device as a display unit 1001.

The organic EL device according to the embodiment may be applied to, not limited to the mobile phone, various electronic apparatuses such as an electronic book, a personal computer, digital still camera, a liquid crystal television, a view finder type or monitor direct vision-type video tape recorder, a car navigation apparatus, a pager, an electronic pocket book, a calculator, a word processor, a work station, a television phone, a POS terminal, an apparatus having a touch panel, and the like. By applying the organic EL device according to the present invention to all the electronic apparatus described above, it is possible to accomplish enhancement of display quality.

Although the preferred embodiments of the present invention have been described with reference to the attached drawings, the present invention is not limited to the embodiments, of course. Various shapes or combinations of the respective constituent members described in the above-mentioned embodiments are examples and may be variously changed on requests in design without departing from the gist of the present invention.

What is claimed is:

1. An organic EL device, comprising:
a plurality of pixels arranged in an effective display area of a substrate, each pixel being provided with a first organic EL element having a functional film formed by a liquid phase method; and
a dummy area having a plurality of dummy pixels for inspection of characteristics provided around the effective display area, each dummy pixel being provided with a second organic EL element having a functional film formed using the same process as the functional film of the first organic EL element, the dummy pixels not including switching structures;
each second organic EL element being equally illuminable as each first organic EL element by current supplied from respective power source lines.

2. The organic EL device according to claim 1,
signals supplied to the pixels of the effective display area being corrected on the basis of the inspection result of the dummy pixels.

3. The organic EL device according to claim 2,
the dummy area having a plurality of first dummy pixels arranged along the outer circumference of the effective display area and the signals supplied to the pixels being corrected on the basis of the inspection result of the first dummy pixels.

4. The organic EL device according to claim 2,
the dummy area having a plurality of second dummy pixels arranged perpendicularly to the outer circumference of the effective display area and a variation in thickness of the functional film at the outer circumferential portion of the effective display area being detected on the basis of a continuous variation in a luminescent characteristic of the second dummy pixels arranged toward the effective display area from the outer circumference of the dummy area.

5. The organic EL device according to claim 4, the second dummy pixels being connected in series to each other.

6. An electronic apparatus comprising the organic EL device according to claim 1.

7. An organic EL device, comprising:
a plurality of pixels arranged in an effective display area of a substrate, each pixel being provided with a first organic EL element having a functional film formed by a liquid phase method; and
a dummy area having a plurality of dummy pixels for inspection of characteristics provided around the effective display area, each dummy pixel being provided with a second organic EL element having a functional film formed using the same process as the functional film of the first organic EL element;
each second organic EL element being equally illuminable by current supplied from respective power source lines, and
each of the plurality of dummy pixels of the dummy area emitting one of at least three colors and each of the dummy pixels that emits a same color being connected in series to each other.

* * * * *